United States Patent [19]

Latz

[11] Patent Number: 5,478,459
[45] Date of Patent: Dec. 26, 1995

[54] PLASMA SPUTTERING INSTALLATION WITH MICROWAVE ENHANCEMENT

[75] Inventor: Rudolf Latz, Rodgau-Dudenhofen, Germany

[73] Assignee: Leybold Aktiengesellschaft, Hanau, Germany

[21] Appl. No.: 272,719

[22] Filed: Jul. 8, 1994

[30] Foreign Application Priority Data

Oct. 28, 1993 [DE] Germany .......................... 43 36 830.1

[51] Int. Cl.$^6$ .............................. C23C 14/34; C23C 14/35
[52] U.S. Cl. ................... 204/298.19; 204/298.16; 204/298.38
[58] Field of Search .................. 204/298.02, 298.16, 204/298.17, 298.18, 298.19, 298.38

[56] References Cited

U.S. PATENT DOCUMENTS

| | | | |
|---|---|---|---|
| 4,610,770 | 9/1986 | Saito et al. | 204/192.1 |
| 4,721,553 | 1/1988 | Saito et al. | 204/192.1 |
| 5,006,219 | 4/1991 | Latz et al. | 204/298.6 |
| 5,230,784 | 7/1993 | Yoshida | 204/298.19 |
| 5,296,784 | 3/1994 | Geisler et al. | 315/111.41 |
| 5,397,448 | 3/1995 | Gesche et al. | 204/298.16 |

FOREIGN PATENT DOCUMENTS

| | | |
|---|---|---|
| 447850 | 9/1991 | European Pat. Off. . |
| 263648 | 1/1989 | German Dem. Rep. . |
| 4134900 | 5/1992 | Germany . |
| 4210284 | 9/1993 | Germany . |
| 4230290 | 3/1994 | Germany . |
| 4230291 | 3/1994 | Germany . |
| 62-170475 | 7/1987 | Japan . |
| 63-297557 | 12/1988 | Japan . |

OTHER PUBLICATIONS

Yoshida, Property of a Microwave Magnetron Plasma Source Inside a Coaxial Line, J. Appl. Physics vol. 31 (1992) 1480–84.

Yoshida, Microwave Enhanced Magnetron Sputttering, Rev. Sci. Instr. 63(1) Jan. 1992 pp. 179–183.

Primary Examiner—Aaron Weisstuch
Attorney, Agent, or Firm—Felfe & Lynch

[57] ABSTRACT

A microwave ring resonator surrounds a cathode target and feeds microwaves to a plasma volume over the target through a slit system in such a way that the waves do not pass through the cathode dark space.

14 Claims, 2 Drawing Sheets

PLASMA SPUTTERING INSTALLATION WITH MICROWAVE ENHANCEMENT

BACKGROUND OF THE INVENTION

The invention relates to a plasma sputtering installation of the type having a target at an electric potential and a microwave source which feeds microwaves into the plasma volume over the target.

Installations of this type are used, for example, when applying thin layers on glass panes, films of synthetic materials or the like. These thin layers often serve very different purposes. For example, coated windows reflect or transmit light of particular wavelengths while coated plastic eye glasses receive a harder surface. In the case of compact disks, the issue is the reflection or non-reflection of laser beams, which, in turn, comprises information about music or voice content.

For applying thin layers, numerous processes have already been suggested, of which only galvanotechnics and coating out of a plasma are mentioned.

In coating out of a plasma the so-called sputtering technique has assumed great importance. Herein a target comprising a particular metal is disposed at an electrode and sputtered by impinging charged particles, for example ions. The sputtered particles are subsequently deposited on a substrate, for example a pane of glass.

In a known configuration for generating a transparent and electrically conducting layer comprising In—O, Sn—O, Zn—O, Cd—Sn—O or Cd—In—O, target material is sputtered wherein the strength of a magnetic field on the surface of the target is 600 Oe or higher and wherein the target is supplied with a dc voltage on which is superimposed a high-frequency alternating voltage (EP-A-0447 850). Of the target materials used here, the target based on In—O with a small quantity of Sn added—often called ITO—yields a layer with a very low resistance value.

In order to improve the sputtering effect, it is further known to feed microwaves into the plasma (U.S. Pat. No. 4,610,770, U.S. Pat. No. 4,721,553, DE-A-3 920 834, JP-A-62 170 475, JP Patents Abstracts C- 469, Jan. 16, 1988, Vol. 12, No. 15; JP-A-63 297 557, JP Patents Abstracts C-581, Apr. 4, 1989, Vol. 13, No. 134). Herein, microwaves are introduced into the plasma region either parallel or perpendicularly to the substrate surface.

DE-A 42 30 290 and DE-A 42 30 291 suggest irradiation of microwaves into the plasma. However, the discharge voltages during the sputtering of the target, in particular during ITO sputtering, are herein still relatively high.

SUMMARY OF THE INVENTION

According to the invention, a microwave ring resonator surrounds the target and feeds the microwaves through a slit system into the plasma volume over the target.

The advantage achieved with the invention resides in that the discharge voltage during the sputtering is considerably reduced, in the case of ITO sputtering, for example, from 270 V to −100 V. This effect is the result of using a microwave ring resonator whose microwaves are coupled via different slit configurations into the plasma volume where they contribute to additional ionization and consequently reduce the discharge voltage. Since the microwave coupling does not take place through the dark space of the cathode but rather through separate slits, arcing is avoided in which sparkovers occur. The ring resonator configuration according to the invention is very compact and simple in comparison to other configurations. It can readily be combined with long cathodes. Moreover, a ring resonator has the advantage that it is a resonator having no interfering reflections at end surfaces.

DETAILED DESCRIPTION OF THE PREFERRED EMBODIMENT

Figure 1:
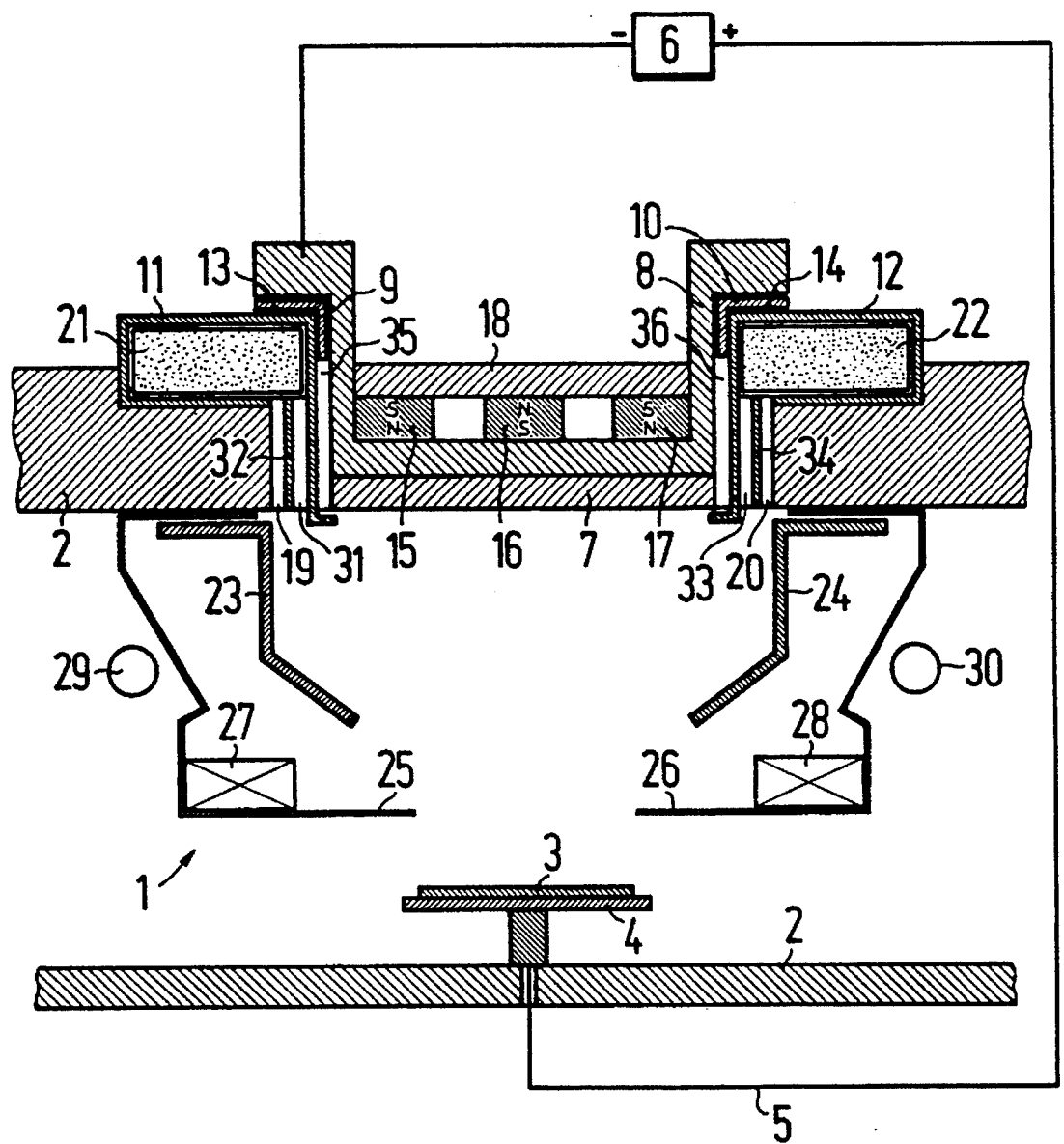
FIG. 1 is a section of a plasma chamber with a magnetron cathode including means for microwave irradiation.

In FIG. 1 is shown a section of a plasma chamber 1 whose housing 2 is only partially shown. In this housing 2 there is disposed a substrate 3 to be coated and which is held on a support 4 which via an electric line 5 is connected to the positive pole of a power supply 6. It is understood that the support 4 which serves as a mounting for the substrate 3 does not need to be stationary, it can also be a moving carrier as is the case in in-line installations. The support 4 also does not need to be connected to the positive potential but rather can also be implemented as an electrically isolated element or be connected to a special voltage source. With a special voltage source, a bias voltage can be applied with the aid of which it is possible to control somewhat the magnitude of the energy of the ions which impinge on the substrate 3.

Opposing the substrate 3 there is provided a sputtering electrode 7 which is connected with a cathode tub 8. The cathode tub 8 is connected to the negative pole of the power supply 6. The cathode tub 8 rests on electrical insulators 9, 10 which, in turn, rest on a resonator housing 11, 12 and comprise sealing rings 13, 14.

In the cathode tub 8 there are three permanent magnets 15 to 17 with a yoke 18. On both sides of the sputtering electrode 7 a slit system representing an opening of the resonator housing 11, 12 is provided. In the resonator housing 11, 12 there is provided a first slit 19 or 20 and a second slit 31 or 33 which in each instance are separated one from the other by a separating panel 32 or 34. The separating panels 32, 34 comprise a metal such as copper, molybdenum or aluminum. However, they can also comprise a microwave low-loss dielectric such as polytetrafluoroethylene (PTFE), quartz, Trolon or polystyrene. The number of slits 19, 31 or 20, 33 is not limited to two. The greater the number of slits, the more microwave energy is coupled per unit distance from the resonator into the plasma volume. However, if the number of slits is too great, too much microwave energy per unit distance is coupled out so that it is no longer possible to couple out the microwave energy with uniform intensity along the length of the cathode into the plasma volume. On the other hand, it is possible to utilize this effect if at various sites along the cathode a different level of microwave energy is to be coupled out of the resonator.

The width of the slit openings is determined by the minimum distance at which a plasma is ignited in the slit openings. Depending on the gas pressure and magnetic field present, this distance is between 0.5 mm and 3 mm. The slit width must be selected so that no plasma can burn in the slits. Parallel to these slits extend the cathode dark spaces 35 and 36. The dark spaces 35 and 36 are between the cathode and the outer walls 11, 12 of the ring resonator, which are at ground potential.

The slit systems are bounded by reflector sheets 23, 24 under which is disposed a cathode shielding box 25, 26 which encloses in each instance an electromagnet 27, 28 and is surrounded by gas inlet pipes 29, 30.

The resonators 21 or 22 are operated at microwave frequencies in the gigahertz range, preferably at 2.45 GHz. In order to keep the dimensions of the resonators 21, 22 small, their inner volume is filled with a microwave low-loss dielectric, for example with PTFE, Trolon, polystyrene or the like.

The microwave resonator housing 11, 12 is at ground potential and is separated via a Teflon insulator 9, 10 from the cathode, which is at negative potential.

The microwave energy is coupled via the aforementioned slits 19, 31; 20, 33 from the resonators 21, 22 into the plasma volume. It is therein critical that in this configuration no microwave energy passes into the dark space 35, 36 of the cathode 8 since this would lead to arcing in the dark space 35, 36. It is also possible to use electromagnets 27, 28 to increase the ionization effect of the microwave energy in the plasma which is encompassed by a cathode shielding box 25, 26.

Figure 2:
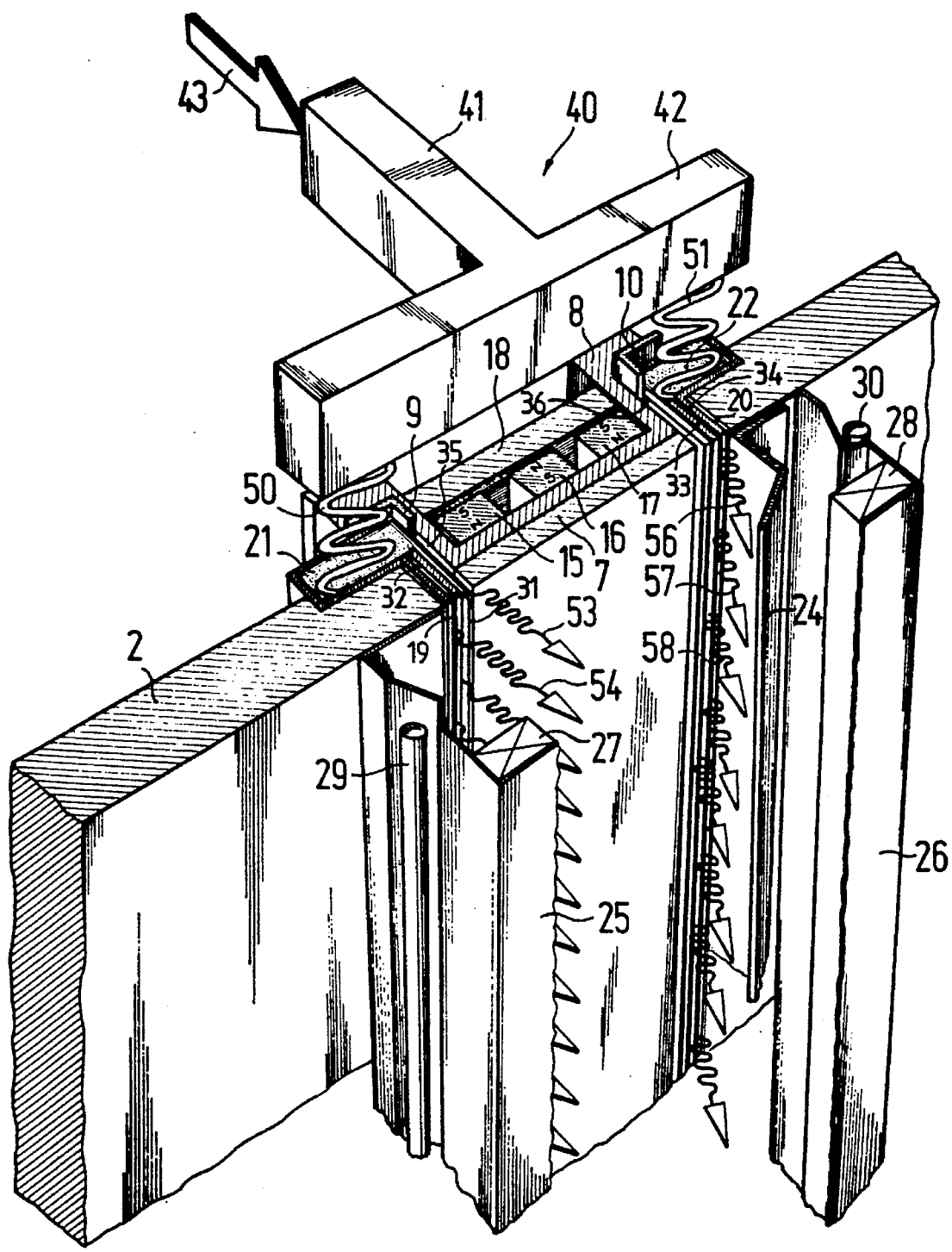
FIG. 2 is a perspective representation of the irradiation region of the microwave into the plasma chamber.

In FIG. 2 there is shown the configuration of FIG. 1 in perspective view. Waveguide T element 40 with which the microwaves are fed is readily apparent. This T element comprises a transverse rectangular waveguide 42 with a rectangular feeder waveguide 41 feeding microwaves 43 perpendicularly to it. The transverse waveguide 42 is open in the downward direction so that the microwaves 50, 51 exiting from it reach the resonator 11, 12 disposed below. From slits 19, 31 or 20, 33 exit microwaves which are here symbolized by wavy arrows 53, 54 or 56, 57, 58.

The lower portion of the resonator is not shown in further detail in FIG. 2 since it looks like the upper portion. Only a waveguide for coupling in the microwaves 50, 51 is omitted. In this way a closed circuit results.

Since the cathode depicted in FIG. 1 and 2 is a rectangular cathode, the ring resonator is also a rectangular ring resonator. If a round cathode were used, a circular ring-form resonator would be more advantageous.

I claim:

1. Plasma sputtering apparatus with microwave enhancement, comprising:

a target having a plasma volume thereover, cathode means for applying an electric potential to said target, dark space means circumferentially outside of said cathode means, a microwave ring resonator surrounding said cathode means, a microwave source for providing microwaves to said ring resonator, and slit means communicating between said ring resonator and said plasma volume circumferentially outside said dark space means so that microwaves can be fed from said resonator to said plasma volume without passing through said dark space means.

2. Plasma sputtering apparatus as in claim 1 wherein said ring resonator is filled with a microwave low loss dielectric.

3. Plasma sputtering apparatus as in claim 2 wherein said dielectric is PTFE, Trolon, or polystyrene.

4. Plasma sputtering apparatus as in claim 1 further comprising magnet means arranged so that said cathode means is a magnetron cathode.

5. Plasma sputtering apparatus as in claim 4 further comprising electromagnets adjacent to said target, said apparatus further comprising a shielding box in which said electromagnets are disposed.

6. Plasma sputtering apparatus as in claim 1 wherein said ring resonator has an operating frequency of 2.45 GHz.

7. Plasma sputtering apparatus as in claim 1 wherein said ring resonator is at ground potential.

8. Plasma sputtering apparatus as in claim 1 further comprising electrical insulation means between said ring resonator and said cathode means.

9. Plasma sputtering apparatus as in claim 1 further comprising reflector means surrounding said plasma volume.

10. Plasma sputtering apparatus as in claim 1 wherein said slit means is configured to feed a uniform microwave intensity to said plasma volume.

11. Apparatus as in claim 1 wherein said slit means comprises a plurality of slits separated by baffle means.

12. Apparatus as in claim 1 wherein said slit means are separated from said dark space means by a wall.

13. Apparatus as in claim 11 wherein said target has parallel edges and a target surface therebetween, said slit means comprising at least one planar slit parallel to each edge.

14. Apparatus as in claim 13 wherein each slit is arranged to emit microwaves substantially perpendicular to said target surface.

\* \* \* \* \*